US006204098B1

(12) United States Patent
Anceau (10) Patent No.: US 6,204,098 B1
(45) Date of Patent: Mar. 20, 2001

(54) METHOD OF FORMATION IN A SILICON WAFER OF AN INSULATED WELL (75) Inventor: Christine Anceau, Saint Roch (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/426,221

(22) Filed: Oct. 22, 1999

(30) Foreign Application Priority Data

Oct. 23, 1998 (FR) .................................... 98 13541

(51) Int. Cl.⁷ .......................... H01L 21/00; H01L 21/336
(52) U.S. Cl. ......................... 438/149; 438/269; 438/404; 438/405; 438/413
(58) Field of Search ..................................... 438/149, 150, 438/151, 152, 404, 405, 413, 268, 269; 257/306, 500

(56) References Cited

U.S. PATENT DOCUMENTS

| 4,507,158 | * | 3/1985 | Kamins et al. | 148/175 |
| 4,908,328 | | 3/1990 | Hu et al. | 437/63 |
| 4,963,505 | | 10/1990 | Fujii et al. | 437/62 |
| 5,049,521 | * | 9/1991 | Belanger et al. | 437/62 |
| 5,164,218 | * | 11/1992 | Tsuruta et al. | 437/6 |
| 5,433,168 | * | 7/1995 | Yonehara | 117/90 |
| 5,700,712 | * | 12/1997 | Schwalke | 437/62 |
| 5,767,562 | * | 6/1998 | Yamashita | 257/500 |
| 5,811,315 | * | 9/1998 | Yindepool et al. | 437/62 |
| 5,825,067 | * | 10/1998 | Takeuchi et al. | 257/355 |
| 6,008,687 | * | 12/1999 | Orita et al. | 327/515 |

OTHER PUBLICATIONS

Patent Abstracts of Japan, vol. 097, No. 012, Dec. 25, 1997 & JP–A–09 223730 (Denso Corp.).
Patent Abstracts of Japan, vol. 097, No. 004, Apr. 30, 1997 & JP–A–08 330581 (Nippondenso Co., Ltd.).

* cited by examiner

Primary Examiner—John F. Niebling
Assistant Examiner—Viktor Simkovic
(74) Attorney, Agent, or Firm—Wolf, Greenfield & Sacks, P.C.; James H. Morris; Theodore E. Galanthay

(57) ABSTRACT

A method of forming an insulated well in an upper portion of a silicon substrate, including the steps of providing a structure of silicon-on-insulator type including a silicon substrate, an insulating layer, and a thin single-crystal silicon layer; removing the insulating layer and the thin silicon layer outside locations where the insulated well is desired to be formed; growing an epitaxial layer; performing a planarization; and making a vertical insulating wall above the periphery of the maintained portion of the thin insulating layer.

8 Claims, 6 Drawing Sheets

METHOD OF FORMATION IN A SILICON WAFER OF AN INSULATED WELL

BACKGROUND OF THE INVENTION

1. Field of the Invention

The present invention relates to the manufacturing of semiconductive chips including at least one area corresponding to power components and at least one area corresponding to logic components.

2. Discussion of the Related Art

For a long time, designers and manufacturers of semiconductor components have attempted to integrate, on the same chip logic circuits and at least one vertical power component having a first electrode located on the upper surface and a second electrode located on the lower surface of the chip. The problem of the isolation of the logic circuits powered by low voltages and conducting small currents, which are likely to be disturbed by the high voltages and currents in the power components, then arises. Conventional solutions, which consist of using junction isolations, are never totally efficient. It has thus been devised to form the logic circuits in a portion dielectrically insulated from the substrate in which the power components are made. An example of such a solution has been described in 1985 by Joseph Borel in European patent 0220974. However, although they are theoretically attractive, the various suggested structures have had difficulties to be implemented, whereby, in practice, no power components associated with logic circuits with a complete or partial dielectric insulation from the power portion are presently available for sale.

SUMMARY OF THE INVENTION

An object of the present invention is to provide a solution to this problem which in particular fulfils the following criteria:

there is no disturbed interface in the vertical area corresponding to the power components; and the apparent surface of the portion of the chip intended for making the logic circuits is at the same level as the upper surface of the chip intended for making a power component.

This second criterion has a great practical importance. Indeed, performing photolithography operations on surfaces located in distinct planes complicates manufacturing processes.

To achieve this and other objects, the present invention provides a method of forming an insulated well in an upper portion of a silicon substrate, including the steps of providing a structure of silicon-on-insulator type including a silicon substrate, an insulating layer, and a thin single-crystal silicon layer; removing the insulating layer and the thin silicon layer outside locations where the insulated well is desired to be formed; growing an epitaxial layer; performing a planarization; and making a vertical insulating wall above the periphery of the maintained portion of the thin insulating layer.

According to an embodiment of the present invention, the epitaxial layer has a thickness greater than 10 μm.

According to an embodiment of the present invention, the thickness of the epitaxial layer is on the order of 40 to 60 μm.

According to an embodiment of the present invention, the step of etching the thin single-crystal silicon layer and the insulating layer includes the steps of forming a layer of a first material selectively etchable with respect to silicon; depositing and delimiting a resist mask; etching the layer of the first material and the thin silicon layer; depositing a new resist layer extending beyond the layers already etched; etching the insulating layer under the new resist layer; removing the resist and the remaining upper portion of the layer of the first material.

According to an embodiment of the present invention, the insulating layer and the layer of the first material are silicon oxide layers.

According to an embodiment of the present invention, the forming of the vertical insulating wall includes the steps of forming a layer of a second material of a first thickness; forming in the layer of the second material a first opening at the location of the wall which is desired to be formed; forming a layer of a third material of a second thickness; etching the layer of the second material substantially in the middle of the first opening; opening the underlying silicon down to the bottom oxide insulting layer; forming an insulation on the opening walls; filling with polysilicon.

According to an embodiment of the present invention, the second and third materials are silicon oxide and the second thickness is smaller than the first thickness.

According to an embodiment of the present invention, the thin single-crystal silicon layer is heavily doped of a selected conductivity type, the epitaxial layer being of the same conductivity type, with a low doping level.

The foregoing objects, features and advantages of the present invention, will be discussed in detail in the following non-limiting description of specific embodiments in connection with the accompanying drawings.

DETAILED DESCRIPTION

It should be noted that, as usual in the field of the representation of semiconductor components, the various cross-sectional views are drawn to scale neither for a given drawing, nor from one drawing to another. To obtain the real dimensions of the various components, one should refer to the general knowledge of those skilled in the art or to the indications given in the present description.

Figure 1:
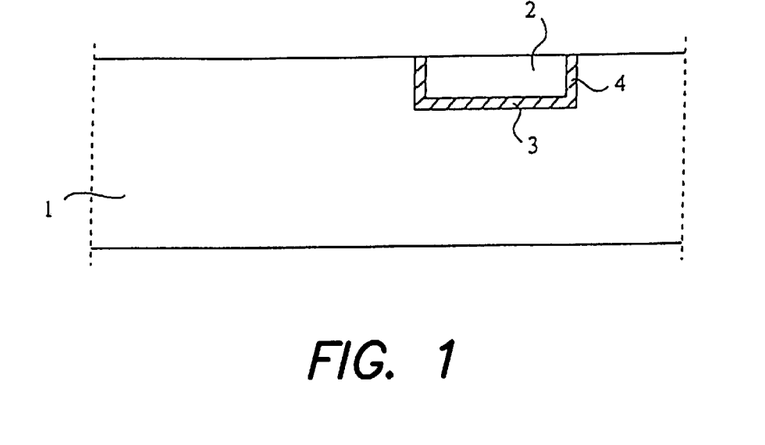
FIG. 1 shows a structure that the present invention obtains.

FIG. 1 is a cross-sectional view of the semiconductive structure that the present invention aims at manufacturing. Essentially, the present invention aims at forming a semiconductive wafer 1 including a semiconductive region 2 insulated from the rest of wafer 1 by a dielectric bottom insulation 3 and by a lateral insulation 4, preferably dielectric, but possibly by junction. Outside the vertical region corresponding to dielectric insulation area 2, the substrate must not have defective areas between its upper and lower surfaces. Further, it is desired to obtain a structure in which the upper surface of substrate 1 is at the same level as the upper surface of insulated region 2.

The main features of the method according to the present invention will first be very schematically described in relation with FIGS. 2A to 2D.

Figure 2A:
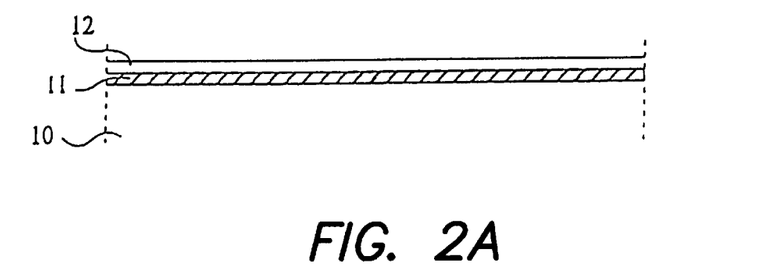
FIGS. 2A to 2D are cross-sectional views illustrating general steps of the manufacturing method according to the present invention.

According to the present invention, the method starts from a structure such as illustrated in FIG. 2A including a silicon substrate 10 coated with a silicon oxide layer 11 itself coated with a thin single-crystal silicon layer 12. Such structures, called SOI (silicon-on-insulator), have developed in the last years for the manufacturing of fast integrated circuits protected from radiation. Given the increasing demand for such structures, their price is now quite accessible and there are various manufacturing techniques to obtain them. It should be noted that in such structures, single-crystal silicon substrate 10 is of good crystallographic quality, as well as thin silicon layer 12, and that the disturbances, if any, are concentrated at the level of insulating layer 11. For example, structures in which the silicon oxide layer has a thickness from 0.2 to 3 $\mu$m and the single-crystal silicon layer has a thickness from 0.1 to 1.5 $\mu$m are presently available for sale.

Figure 2B:
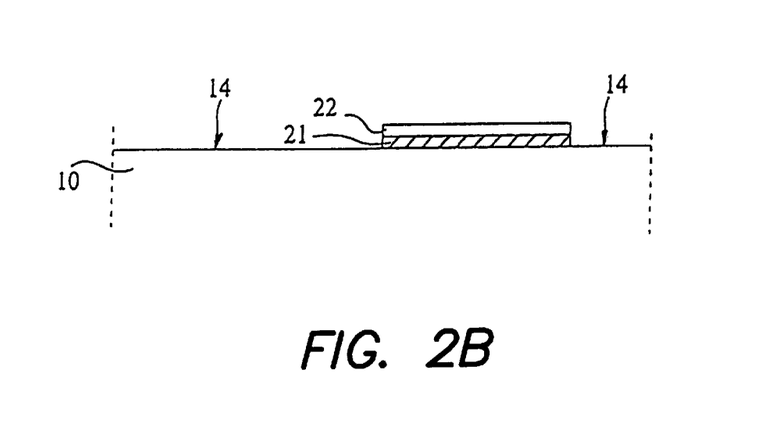

In a first step of the method according to the present invention, the result of which is illustrated in FIG. 2B, a portion of thin single-crystal silicon layer 12 and of underlying silicon oxide layer 11 is removed down to upper surface 14 of single-crystal silicon substrate 10. A portion 21 of insulating layer 11 topped with a portion 22 of silicon layer 12 is left in place only at the locations where insulated silicon wells are desired to be formed.

Figure 2C:
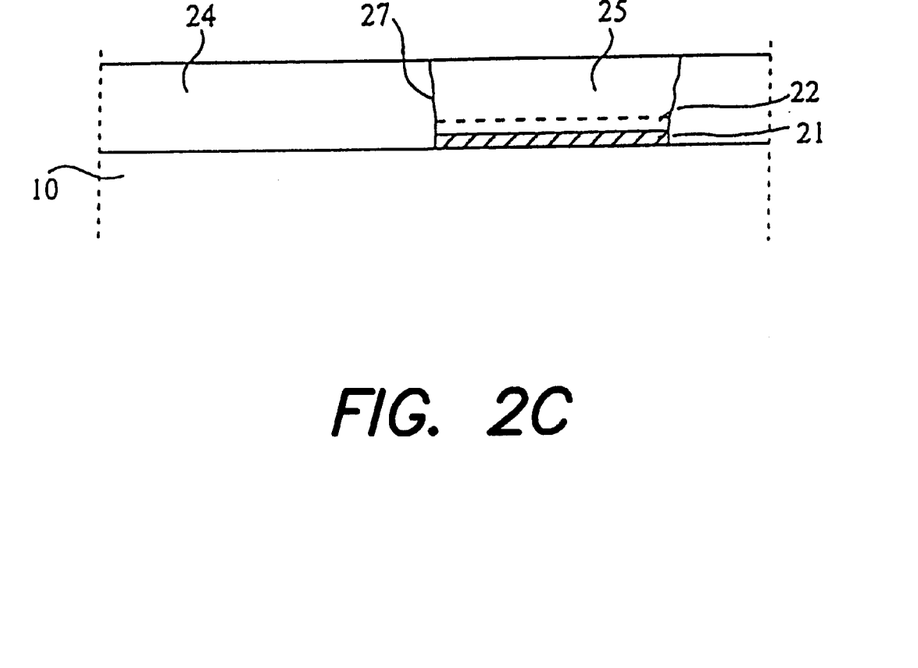

After this, an epitaxial silicon growth is performed on the structure. A single-crystal silicon layer 24 of same crystallographic orientation as substrate 10 thus develops above apparent surface 14 of the substrate and a single-crystal silicon layer 25 of the same crystal orientation as thin silicon layer 22 develops above layer 22. There will exist a crystallographically disturbed area (grain boundary) 27 only at the interface between layers 24 and 25. FIG. 2C shows the structure after the upper surface of the structure has undergone a planarization processing, for example, by chemical-mechanical polishing. Indeed, during the growth, the upper surface of layer 25 will generally be higher than the upper surface of layer 24.

Figure 2D:
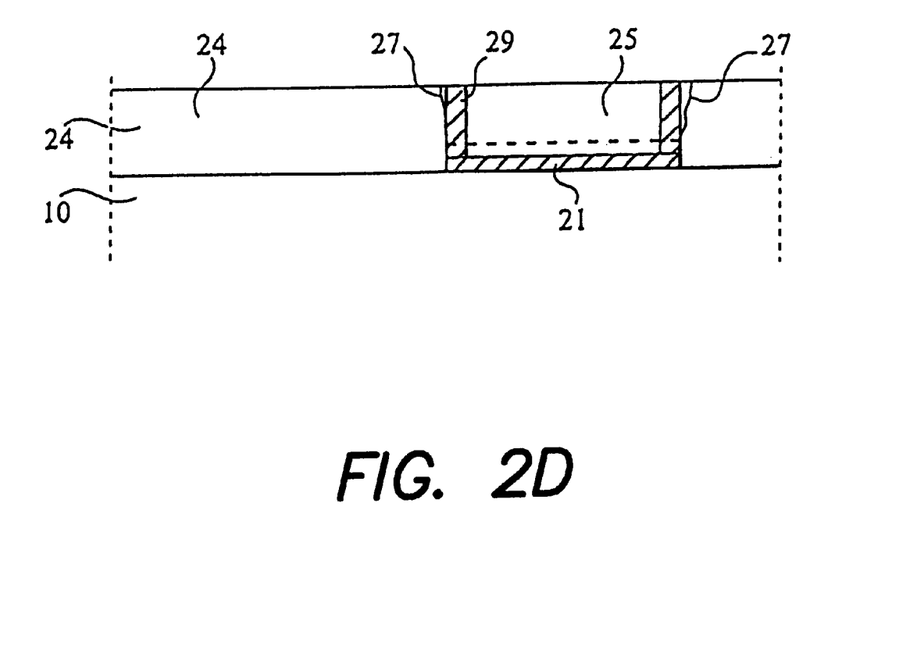

In a last step, the result of which is illustrated in FIG. 2D, vertical insulating walls 29 are formed, preferably in an insulating material, to join lower insulating layer portion 21 to completely enclose epitaxial layer 25. As shown in FIG. 2D, the upper surface of region 25 is at the same level as the upper surface of region 24 due to the planarization step described in relation with FIG. 2C. Further, the thickness of epitaxial layers 24, 25 can be relatively large, for example, from 10 to 100 $\mu$m.

As will be seen hereafter, substrate 10 may be a substrate with a homogeneous doping or a substrate including a higher and/or lower portion with a greater doping level than its median portion. According to the applications aimed at, layer 24 may be of the same conductivity type as the substrate or of the opposite conductivity type. Similarly, its doping level will be chosen according to the components to be formed.

A detailed example of implementation of the method according to the present invention will be described in relation with FIGS. 3A to 3K. In these drawings, the same references as in FIGS. 2A to 2D have been used to designate similar elements. A specific object of this embodiment is to avoid any disturbance of the crystallographic quality of the structure at the locations where vertical power semiconductor components are desired to be made.

Figure 3A:
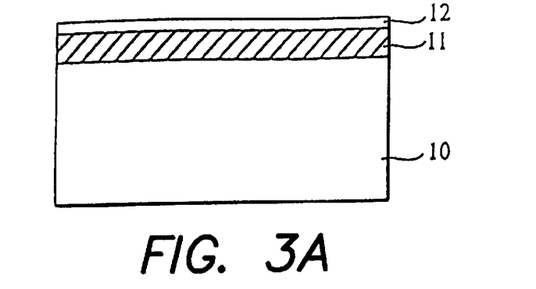
FIGS. 3A to 3K shows in more detail steps of the manufacturing method according to the present invention.

FIG. 3A, like FIG. 2A, shows a silicon wafer 10 coated with a thin silicon oxide layer 11, itself coated with a thin single-crystal silicon layer 12. The essential function of single-crystal silicon layer 12 being to be used as a basis for the growth of an epitaxial layer, its thickness will be chosen to be as thin as possible to minimize the step height difference after epitaxy between areas 24 and 25 (see FIG. 2C) while being compatible with a thin oxidation from 20 to 30 nm. Its doping may be of a type and/or level different from those of the subsequent epitaxy according to the needs in the insulated area. A structure in which single-crystal silicon layer 12 has a thickness under 1 $\mu$m will for example be chosen.

The steps described in relation with FIGS. 3B to 3E correspond to the step described in relation with FIG. 2B.

Figure 3B:
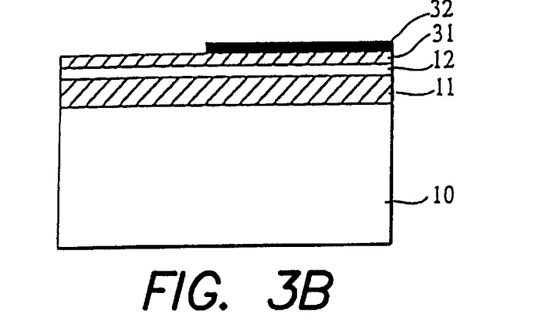
Figure 3C:
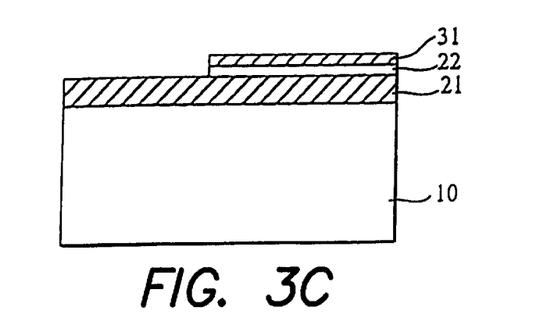

At the step illustrated in FIG. 3B, the structure is coated with a thin uniform silicon oxide layer 31 of a thickness from 20 to 30 nm, after which a resist layer 32 is deposited, to be removed at the locations where the substrate is desired to be exposed. At the step illustrated in FIG. 3C, a successive etching of oxide layer 31 and of thin single-crystal silicon layer 12 has been performed, and resist 32 is removed. Thin oxide 31 is etched by dry or wet etching and silicon 12 is etched by dry etching according to conventional technologies for this thickness range. The remaining portion of layer 12 is designated by reference 22.

Figure 3D:
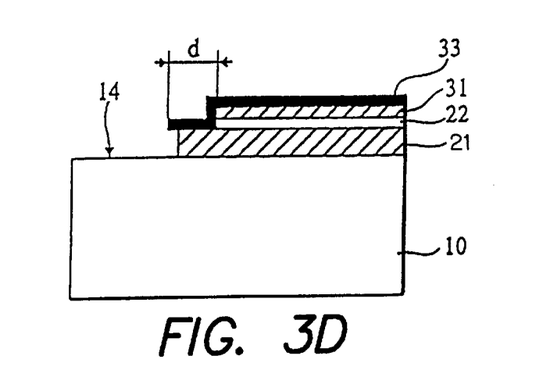

At the step illustrated in FIG. 3D, the structure has been coated with a resist layer 33 which has been opened substantially at the locations where substrate 10 is desired to be exposed. The etching of resist layer 33 is performed to ensure that there is a given extension d of this resist layer beyond the remaining portions 22 of the previously-etched single-crystal silicon layer. This essentially aims at avoiding the occurrence of a cap of single-crystal silicon layer 22 above the power area. Distance d is as small as possible with the alignment equipment used and taking account of the overetch of the method of etching layer 11. Oxide layer 11, the remaining portions of which are designated by reference 21, is etched by wet etching, so as not to damage the apparent surface 14 of silicon substrate 10.

Figure 3E:
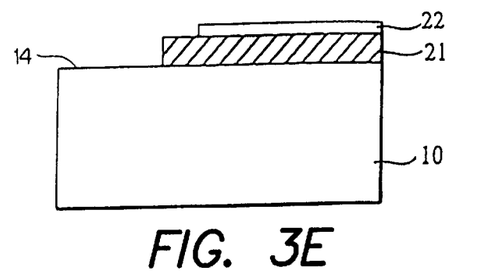

At the step illustrated in FIG. 3E, resist layer 33 and thin oxide layer 31 have been removed to obtain silicon oxide layer portion 21 and single-crystal silicon layer portion 22 such as described in relation with FIG. 2B.

An advantage of the described method is that at no time during an etch phase is a resist layer in direct contact with a single-crystal silicon layer. Indeed, it is known that such a contact risks, during etch operations, generation of pollutants likely to cling to the free silicon surface. Now, it is desired to have a particularly high-quality free silicon surface to enable formation of a satisfactory epitaxial layer.

Figure 3F:
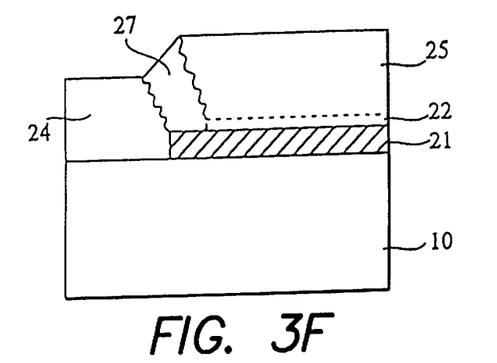
Figure 3G:
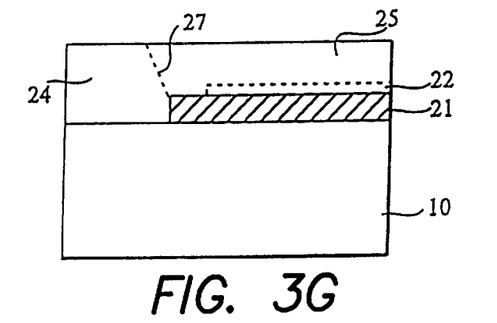

The steps described in relation with FIGS. 3F and 3G correspond to the step described in relation with FIG. 2C.

At the step illustrated in FIG. 3F, the result of the growth of an epitaxial layer of a thickness greater than 10 $\mu$m has been shown. Single-crystal silicon epitaxial layers 24 and 25 separated by a grain boundary area 27 at the location where the epitaxies join will thus be obtained. With respect to a plane 100, the opening edges are oriented according to direction <010>. A chemical-mechanical planarization, the result of which is illustrated in FIG. 3G, is then performed.

The steps illustrated in FIGS. 3H to 3K illustrate an embodiment of the formation of vertical insulating walls 29 described in relation with FIG. 2D.

Figure 3H:
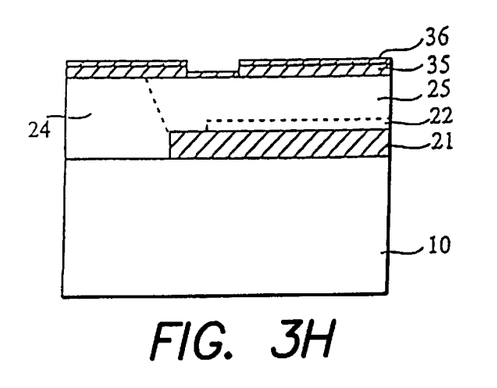

At the step illustrated in FIG. 3H, a first oxide layer 35 of a thickness on the order of 1 $\mu$m has first been formed, in which an opening has been formed at the location where the wall is desired to be formed. A second oxide layer 36 of thickness smaller than that of the first oxide layer, for example, on the order of 200 to 300 nm, has then been deposited.

Figure 3I:
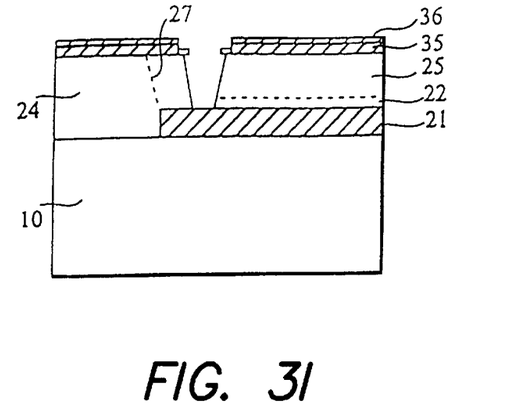

At the step illustrated in FIG. 3I, an opening of a width of, for example, 2 $\mu$m, has been etched in second oxide layer 36 at the bottom of the opening made in first oxide layer 35; single-crystal silicon 25 has then been etched by dry etch according to the wall contour; and the resist which has been used to define the opening in the internal portion of layer 36 has been removed. A partial deoxidization then enables removing the oxide cap due to the slight overetch of silicon 25 under oxide 36.

Figure 3J:
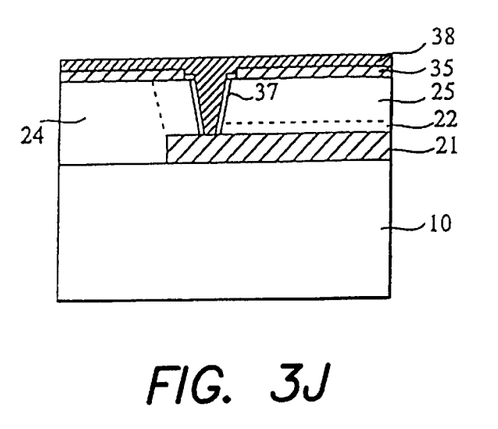

At the step shown in FIG. 3J, the growth of an oxide layer 37 to insulate the lateral walls of the opening corresponding to the insulating wall, then the deposition of a polysilicon filling layer 38 to fill up the opening, have successively been performed.

Figure 3K:
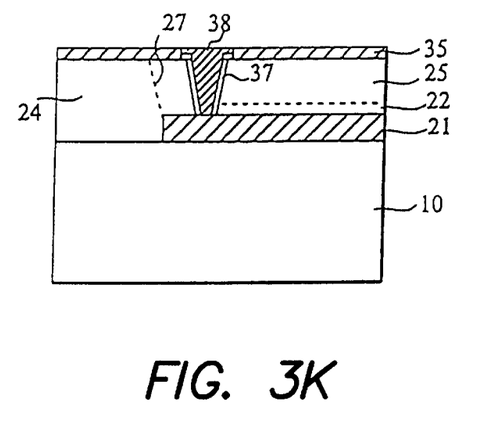

Finally, as shown in FIG. 3K, polysilicon layer 38 is removed by chemical-mechanical planarization carried on until the single-crystal silicon level is reached. A structure including distinct single-crystal silicon areas, some corresponding to regions 24 in which non-disturbed single-crystal silicon from one surface of the structure to the other can be found, the others corresponding to regions 25 forming wells completely insulated from substrate 10, is obtained. Disturbed area 27 is in the immediate neighborhood of the insulating wall and is not likely to disturb the components which will be formed in insulated well 25 or in the assembly of substrate 10 and of epitaxial layer 24.

Figure 4:
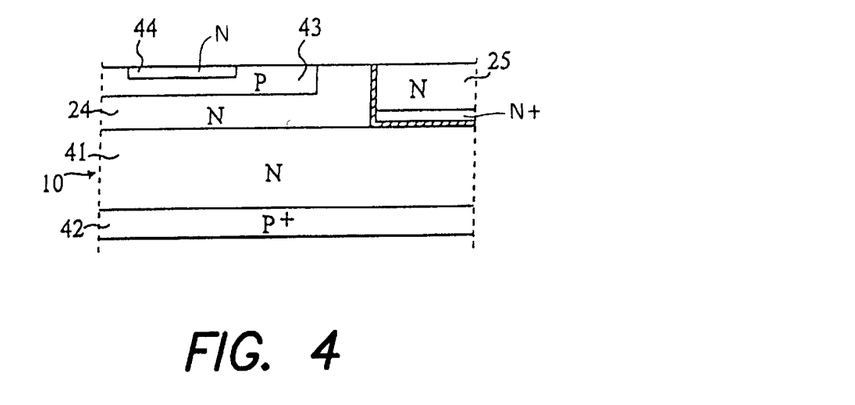
FIGS. 4 to 6 show an example of a structure made with the method according to the present invention.

FIG. 4 illustrates an example of a structure which can be obtained by the method according to the present invention. In the example of FIG. 4, initial substrate 10 is a lightly-doped N-type region 41, the lower surface of which includes a heavily-doped P-type region 42, and the epitaxial layer is a lightly-doped N-type region 24–25. In epitaxial layer 24, a P-type region 43 and an N-type region 44 have been successively formed to obtain a vertical thyristor structure formed of regions 44, 43, 24–41, 42. With this type of power structure, components of bipolar type can simply be formed in well 25. It may be preferred for silicon layer 12 from which well 25 has been developed to be heavily-doped of type N+, to have a heavily-doped N+-type sole at the bottom of the well, this sole corresponding, for example, to collector contact areas of NPN-transistors.

Figure 5:
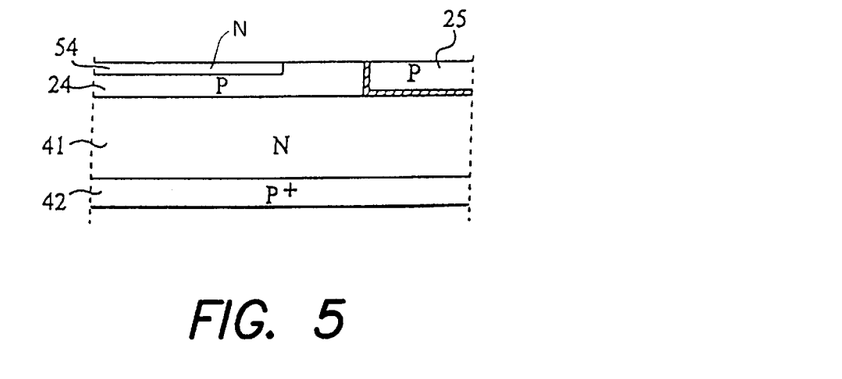

FIG. 5 shows another example of a structure according to the present invention formed from the same N-P substrate 41–42 as that of FIG. 4. On this substrate, a P-type epitaxy 24 inside of which is formed an N-type region 54 is developed. A vertical thyristor including layers 42, 41, 24, and 54 is thus obtained. It should be noted that in this case, the substrate of logic well 25 is of type P whereas it is of type N in the case of FIG. 4.

Figure 6:
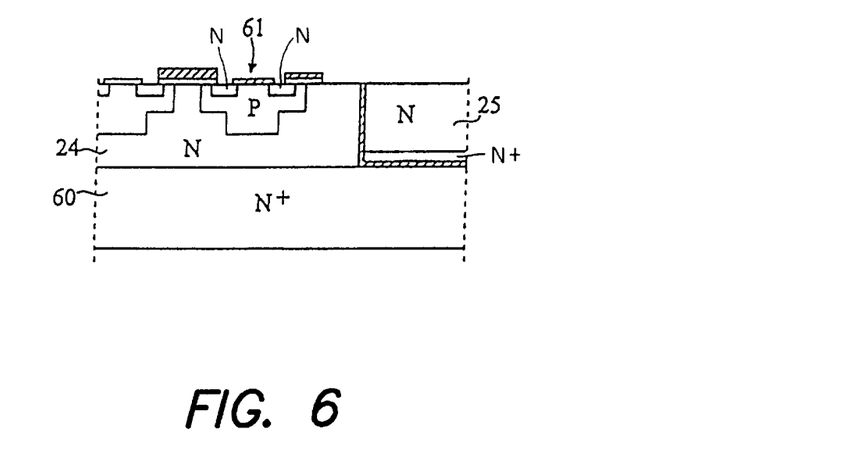

In the example of FIG. 6, the substrate 60 is heavily-doped of type N+ and the epitaxial layer is of type N. In layer 24, vertical DMOS transistor cells 61 are formed. In this case, it will be simple to form in well 25 complementary MOS transistors. As in the case of FIG. 4, it may be preferred to have an N+-type sole at the bottom of the well.

FIGS. 4 and 6 only illustrate examples of application of the present invention. Many other power structures may be made in combination with logic circuits including bipolar transistors, MOS transistors, or both types. Several insulated wells intended for containing logic circuits may be formed in various surface locations of a same substrate.

Of course, the present invention is likely to have various alterations, modifications, and improvements which will readily occur to those skilled in the art. In particular, the materials of the various previously-described layers may be modified according to the technological line chosen, as long as the obtained layers achieve the desired function, that is, for example, forming a mask layer selectively etchable with respect to silicon for layers 11, 31, 35 and 36, or forming a filling layer which is easy to planarize for layer 38. Further, the type of conductivity and the doping level of thin single-crystal silicon layer 12 may be freely chosen in relation with the type of conductivity and the doping level of the epitaxial layer of well 25 to form, if desired, a sole of a specific type at the bottom of the well.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of forming an insulated well in an upper portion of a silicon substrate, including the steps of:
   providing a structure of silicon-on-insulator type including a silicon substrate, an insulating layer, and a thin single-crystal silicon layer;
   removing the insulating layer and the thin silicon layer outside locations where the insulated well is desired to be formed;
   growing an epitaxial layer on all the upper surface of the structure, to form an active layer of the wells and an upper layer of power components outside the region corresponding to the well;
   performing a planarization; and
   making a vertical insulating wall above the periphery of the maintained portion of the thin insulating layer.

2. The method of claim 1, wherein the step of removing the thin single-crystal silicon layer and the insulating layer includes the steps of:
   forming a layer of a first material selectively etchable with respect to silicon;
   depositing and delimiting a resist mask;
   etching the layer of the first material and the thin silicon layer;
   depositing a new resist layer extending beyond the layers already etched;
   etching the insulating layer under the new resist layer;
   removing the resist and the remaining upper portion of the layer of the first material.

3. The method of claim 1, wherein the epitaxial layer has a thickness greater than 10 $\mu$m.

4. The method of claim 3, wherein the thickness of the epitaxial layer is on the order of 40 to 60 $\mu$m.

5. The method of claim 2, wherein the insulating layer and the layer of the first material are silicon oxide layers.

6. The method of claim 1, wherein the forming of the vertical insulating wall includes the steps of:
   forming a layer of a second material of a first thickness;
   forming in the layer of the second material a first opening at the location of the wall which is desired to be formed;
   forming a layer of a third material of a second thickness;
   etching the layer of the third material substantially in the middle of the first opening;
   opening the underlying silicon down to the bottom oxide insulating layer;
   forming an insulation on the opening walls;
   filling with polysilicon.

7. The method of claim 6, wherein the second and third materials are silicon oxide and the second thickness is smaller than the first thickness.

8. The method of claim 1, wherein the thin single-crystal silicon layer is heavily doped of a selected conductivity type, the epitaxial layer being of the same conductivity type, with a low doping level.

* * * * *

UNITED STATES PATENT AND TRADEMARK OFFICE
CERTIFICATE OF CORRECTION

PATENT NO. : 6,204,098 B1
DATED : March 20, 2001
INVENTOR(S) : Christine Anceau

It is certified that error appears in the above-identified patent and that said Letters Patent is hereby corrected as shown below:

The following claims should be added to the patent.

9. The method of claim 1, wherein the step of removing the insulating layer and the thin silicon layer includes etching portions of the insulating layer and the thin silicon layer.

10. The method of claim 9, wherein the step of etching includes the steps of:
forming a layer of a first material;
etching the layer of the first material and the thin silicon layer;
and etching the insulating layer under the new resist layer.

11. The method of claim 10, wherein the step of forming a layer of a
first material includes forming a layer selectively etchable with respect to silicon.

12. The method of claim 11, wherein said forming of a layer of a first material
includes a layer of a first silicon oxide layer.

13. The method of claim 11, including before the step of etching the layer
of the first material, depositing and delimiting a resist mask.

14. The method of claim 13, wherein said step of depositing a new resist layer
includes depositing a new resist layer that extends beyond the layers already etched.

15. The method of claim 14, further including removing the resist and the remaining
upper portion of the layer of the first material.

16. The method of claim 2, wherein the forming of the vertical insulating wall
includes the steps of:
forming a layer of a second material of a first thickness;
and forming in the layer of the second material a first opening at the location of the
wall which is desired to be formed.

17. The method of claim 16, further includinf forming as layer of a third material
of a second thickness and etching the layer of the third material substantially in the
middle of the first opening.

UNITED STATES PATENT AND TRADEMARK OFFICE
CERTIFICATE OF CORRECTION

PATENT NO.    : 6,204,098 B1
DATED         : March 20, 2001
INVENTOR(S)   : Christine Anceau It is certified that error appears in the above-identified patent and that said Letters Patent is hereby corrected as shown below:

18. The method of claim 17, further including opening the underlying silicon down to the bottom oxide insulating layer and forming an insulation on the opening walls.

19. The method of claim 18, further including filling against the insulation on the opening walls with polysilicon.

20. The method of claim 19, wherein the second and third materials are silicon oxide and the second thickness is smaller than the first thickness.

21. The method of claim 1, wherein the forming of the vertical insulating wall includes the steps of:
forming a layer of a second material of a first thickness; and
forming in the layer of the second material a first opening at the location of the wall which is desired to be formed.

22. The method of claim 21, further including forming a layer of a third material of a second thickness in etching the layer of the third material substantially in the middle of the first opening.

23. The method of claim 22, further including opening the underlying silicon down to the bottom oxide insulating layer, forming an insulation on the opening walls, and filling with polysilicon.

UNITED STATES PATENT AND TRADEMARK OFFICE
CERTIFICATE OF CORRECTION

PATENT NO. : 6,204,098 B1
DATED : March 20, 2001
INVENTOR(S) : Christine Anceau

It is certified that error appears in the above-identified patent and that said Letters Patent is hereby corrected as shown below:

24. The method of claim 23, wherein the second and third materials are silicon oxide and the second thickness is smaller than the first thickness.

25. The method of claim 2, wherein the thin single-crystal silicon layer is heavily doped of a selective conductivity type, the epitaxial layer being of the same conductivity type, with a low doping level.

Signed and Sealed this

Fourteenth Day of August, 2001

*Attest:*

*Attesting Officer*

NICHOLAS P. GODICI
*Acting Director of the United States Patent and Trademark Office*